US010878933B2

(12) United States Patent
Jeddeloh et al.

(10) Patent No.: US 10,878,933 B2
(45) Date of Patent: *Dec. 29, 2020

(54) APPARATUSES AND METHODS FOR MEMORY TESTING AND REPAIR

(71) Applicant: Micron Technology, Inc., Boise, ID (US)

(72) Inventors: Joe M. Jeddeloh, Shoreview, MN (US); Brent Keeth, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 142 days.

This patent is subject to a terminal disclaimer.

(21) Appl. No.: 15/910,889

(22) Filed: Mar. 2, 2018

(65) Prior Publication Data
US 2018/0190367 A1 Jul. 5, 2018

Related U.S. Application Data

(63) Continuation of application No. 14/790,485, filed on Jul. 2, 2015, now Pat. No. 9,934,870, which is a (Continued)

(51) Int. Cl.
G06F 11/20 (2006.01)
G11C 29/44 (2006.01)
(Continued)

(52) U.S. Cl.
CPC ........ G11C 29/4401 (2013.01); G06F 11/073 (2013.01); G06F 11/1072 (2013.01);
(Continued)

(58) Field of Classification Search
CPC ............. G11C 29/4401; G06F 11/2017; G06F 11/1088; G06F 11/1666
(Continued)

(56) References Cited

U.S. PATENT DOCUMENTS 5,577,050 A * 11/1996 Bair ........................ G11C 29/72
714/710
6,208,545 B1 3/2001 Leedy
(Continued)

FOREIGN PATENT DOCUMENTS

CN 1767054 A 5/2006
JP 6114540 B2 4/1986
(Continued)

OTHER PUBLICATIONS

US 9,075,770 B2, 07/2015, Jeddeloh et al. (withdrawn)
(Continued)

Primary Examiner — Nadeem Iqbal
(74) Attorney, Agent, or Firm — Schwegman Lundberg & Woessner, P.A.

(57) ABSTRACT

Some embodiments include apparatuses and methods having a first interface to communicate with a processing unit, a second interface to communicate with a memory device, and a module coupled to the first and second interfaces. In at least one of the embodiments, the module can be configured to obtain information stored in the memory device and perform at least one of testing and repairing of a memory structure of the memory device based at least in part on the information.

20 Claims, 10 Drawing Sheets

Related U.S. Application Data continuation of application No. 13/837,345, filed on Mar. 15, 2013, now Pat. No. 9,223,665.

(51) Int. Cl.
    *G06F 11/16*      (2006.01)
    *G11C 29/00*      (2006.01)
    *G06F 11/07*      (2006.01)
    *G06F 11/10*      (2006.01)
    *G11C 29/04*      (2006.01)

(52) U.S. Cl.
CPC ...... *G06F 11/1088* (2013.01); *G06F 11/1666* (2013.01); *G06F 11/2017* (2013.01); *G11C 29/785* (2013.01); *G11C 29/789* (2013.01); *G11C 29/702* (2013.01); *G11C 2029/0401* (2013.01); *G11C 2029/0409* (2013.01); *G11C 2029/4402* (2013.01)

(58) Field of Classification Search
USPC ..... 714/6.13, 6.12, 6.11, 6.1, 6.2, 6.21, 6.23
See application file for complete search history.

(56) References Cited

U.S. PATENT DOCUMENTS

| | | | |
|---|---|---|---|
| 6,324,114 | B1 | 11/2001 | Himeno |
| 6,466,053 | B2 | 10/2002 | Duesman |
| 7,058,865 | B2 | 6/2006 | Mori et al. |
| 7,193,239 | B2 | 3/2007 | Leedy |
| 7,284,166 | B2 * | 10/2007 | Zappa ............... G11C 29/16 714/710 |
| 7,600,165 | B2 * | 10/2009 | Chih ............... G06F 11/1008 714/711 |
| 7,610,523 | B1 | 10/2009 | Singh |
| 7,835,207 | B2 | 11/2010 | Keeth et al. |
| 7,925,949 | B2 | 4/2011 | Jeddeloh |
| 7,978,721 | B2 | 7/2011 | Jeddeloh et al. |
| 7,979,757 | B2 | 7/2011 | Jeddeloh |
| 8,176,371 | B2 | 5/2012 | Jeddeloh |
| 8,254,191 | B2 | 8/2012 | Jeddeloh et al. |
| 8,320,206 | B2 | 11/2012 | Keeth et al. |
| 8,503,258 | B2 | 8/2013 | Keeth et al. |
| 8,787,101 | B2 | 7/2014 | Keeth et al. |
| 9,223,665 | B2 * | 12/2015 | Jeddeloh ............ G06F 11/2017 |
| 9,934,870 | B2 * | 4/2018 | Jeddeloh ............ G06F 11/2017 |
| 2003/0013249 | A1 * | 1/2003 | Honma .......... G01R 31/318511 438/200 |
| 2004/0032781 | A1 | 2/2004 | Cowles et al. |
| 2005/0076194 | A1 | 4/2005 | Kanapathippillai et al. |
| 2005/0146910 | A1 | 7/2005 | Venkatraman et al. |
| 2006/0044896 | A1 | 3/2006 | Taussig et al. |
| 2006/0056247 | A1 | 3/2006 | Satoh |
| 2006/0083099 | A1 | 4/2006 | Bae et al. |
| 2006/0221752 | A1 | 10/2006 | Fasoli et al. |
| 2006/0237833 | A1 | 10/2006 | Klein et al. |
| 2006/0242497 | A1 | 10/2006 | Cowles et al. |
| 2007/0136640 | A1 * | 6/2007 | Jarrar ............... G11C 29/16 714/763 |
| 2008/0198636 | A1 | 8/2008 | Yang et al. |
| 2008/0198646 | A1 | 8/2008 | Park et al. |
| 2008/0282120 | A1 | 11/2008 | Liao et al. |
| 2009/0016130 | A1 | 1/2009 | Menke et al. |
| 2010/0005376 | A1 | 1/2010 | LaBerge et al. |
| 2010/0038802 | A1 | 2/2010 | Chen et al. |
| 2010/0070696 | A1 | 3/2010 | Blankenship |
| 2010/0085825 | A1 | 4/2010 | Keeth et al. |
| 2010/0155912 | A1 | 6/2010 | Patterson |
| 2011/0060888 | A1 | 3/2011 | Keeth et al. |
| 2011/0264858 | A1 | 10/2011 | Jeddeloh et al. |
| 2012/0221911 | A1 | 8/2012 | Jeddeloh |
| 2012/0320688 | A1 | 12/2012 | Jeddeloh et al. |
| 2013/0003473 | A1 | 1/2013 | Keeth et al. |
| 2013/0329510 | A1 | 12/2013 | Keeth et al. |
| 2014/0281693 | A1 | 9/2014 | Jeddeloh et al. |
| 2015/0380109 | A1 | 12/2015 | Jeddeloh et al. |

FOREIGN PATENT DOCUMENTS

| | | |
|---|---|---|
| JP | 05189327 A | 7/1993 |
| JP | 05198199 A | 8/1993 |
| JP | 05258591 A | 10/1993 |
| JP | 05290598 A | 11/1993 |
| JP | 1196081 A | 4/1999 |
| JP | 2001291394 A | 10/2001 |
| JP | 2003007963 A | 1/2003 |
| JP | 2008198355 A | 8/2008 |
| JP | 2008287862 A | 11/2008 |
| WO | WO-9732253 A1 | 9/1997 |
| WO | WO-2010042496 A2 | 4/2010 |
| WO | WO-2010051461 A1 | 5/2010 |
| WO | WO-2010059380 A1 | 5/2010 |
| WO | WO-2010042496 A3 | 7/2010 |

OTHER PUBLICATIONS

"Chinese Application Serial No. 200980139881.2, Office Action dated Apr. 15, 2013", 36 pgs.

"Chinese Application Serial No. 200980139881.2, Office Action dated Dec. 16, 2013", 9 pgs.

"Chinese Application Serial No. 200980139881.2, Response filed Apr. 25, 2014 to Office Action dated Dec. 16, 2013", 23 pgs.

"Chinese Application Serial No. 200980139881.2, Response filed Aug. 23, 2013 to Office Action dated Apr. 15, 2013", 22 pgs.

"European Application Serial No. 09819740.3, Examination Notification Art. 94(3) dated Apr. 10, 2014", 6 pgs.

"European Application Serial No. 09819740.3, Extended Search Report dated Feb. 28, 2012", 7 pgs.

"European Application Serial No. 09819740.3, response filed Sep. 25, 2012 to Extended Search Report dated Feb. 28, 2012", 13 pgs.

"International Application Serial No. PCT/US2009/059669, Search Report and Written Opinion dated Apr. 22, 2010", 13 pgs.

"Japanese Application Serial No. 2011-530299, Office Action dated Feb. 5, 2013", 5 pgs.

"Japanese Application Serial No. 2011-530299, Office Action dated Nov. 12, 2013", 7 pgs.

"Japanese Application Serial No. 2011-530299, Response filed Apr. 4, 2014 to Office Action dated Nov. 12, 2013", 18 pgs.

\* cited by examiner

APPARATUSES AND METHODS FOR MEMORY TESTING AND REPAIR

PRIORITY APPLICATION

This application is a continuation of U.S. application Ser. No. 14/790,485, filed Jul. 2, 2015, now issued as U.S. Pat. No. 9,934,870, which is a continuation of U.S. application Ser. No. 13/837,345, filed Mar. 15, 2013, now issued as U.S. Pat. No. 9,223,665, all of which are incorporated herein by reference in their entireties.

BACKGROUND

Electronic items, such as computers, digital televisions, digital cameras, cellular phones, and many other electronic items, often have a memory device to store information. During manufacturing, testing is routinely performed on the memory device to check for defective memory cells that may exist in the device. Some conventional memory devices may have spare memory cells to replace defective memory cells. After manufacturing, some of these memory devices are often put in an arrangement with other devices to form part of an electronic item. In some cases, testing or repairing some conventional memory devices in such an arrangement may be difficult, expensive, or both.

DETAILED DESCRIPTION

Figure 1:
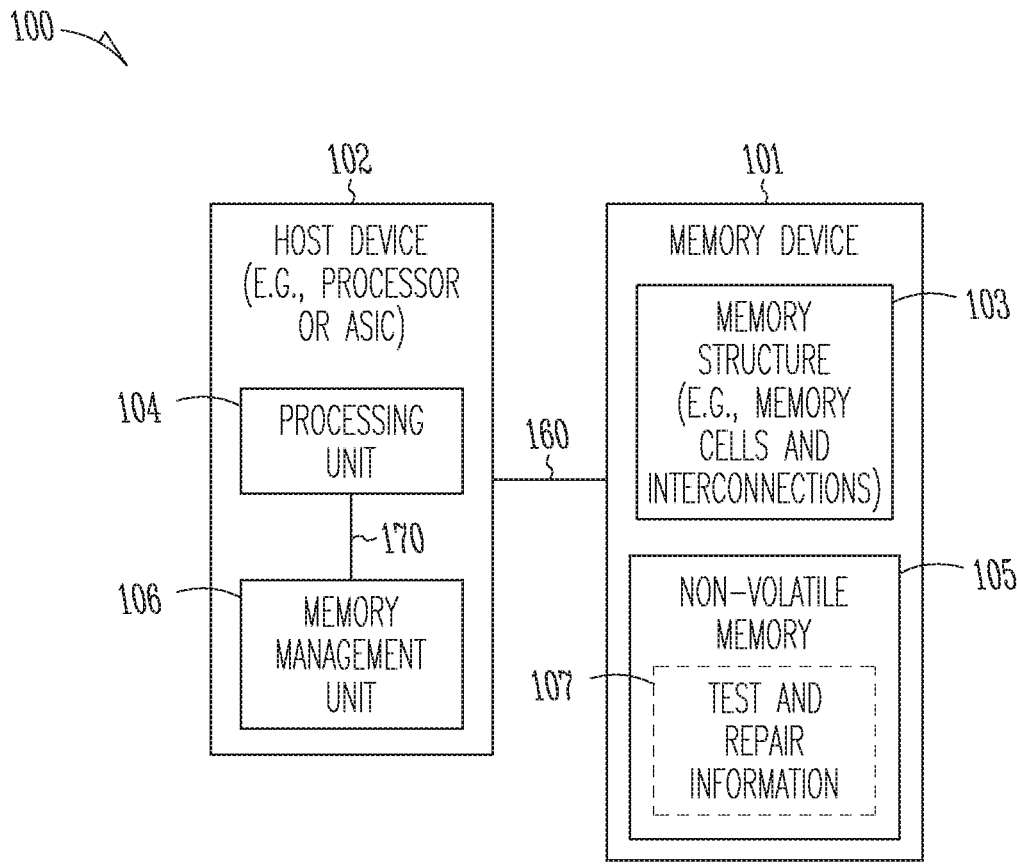
FIG. 1 shows a block diagram of an apparatus including a memory device and a host device, according to some embodiments described herein.

FIG. 1 shows a block diagram of an apparatus 100 including a memory device 101 and a host device 102, according to some embodiments described herein. Apparatus 100 can include or be included in electronic items (e.g., electronic systems) such as computers, digital televisions, digital cameras, cellular phones, and other electronic items. Memory device 101 and host device 102 can be formed in separate chips (e.g., separate semiconductor dice). Memory device 101 and host device 102 can communicate with each other through a connection 160. Connection 160 can include an off-chip connection. For example, connection 160 can include conductive paths (e.g., metal traces) located on a base having a non-silicon-based material (e.g., an organic substrate, such as a printed circuit board) or other types of substrates.

As shown in FIG. 1, memory device 101 can include a memory structure 103 to store information (e.g., data), and a non-volatile memory 105 to store test and repair information 107. Memory structure 103 can include memory cells, such as volatile memory cells (e.g., dynamic random access memory (DRAM) cells) or other types of memory cells. Memory structure 103 can also include other circuit elements associated with the memory cells, such as interconnections (e.g., signal paths), to carry information (e.g., in the form of signals) to and from the memory cells.

In some cases, one or more portions in memory structure 103 may be defective. A defective portion can include one or memory cells in memory structure 103, one or more interconnections, or a combination of both memory cells and interconnections that may operate improperly or may not operate according to designed specification.

A "defective" portion (e.g., memory cells, interconnections, or both) of a memory structure (e.g., memory structure 103) described herein may include both a portion of the memory structure that is actually defective and a portion that has been deemed to be "defective", regardless of whether the portion that has been deemed to be "defective" is actually defective.

Memory structure 103 of memory device 101 can include spare resources to replace a defective portion (or portions). The spare resources in memory structure 103 can include memory cells (redundant memory cells), interconnections (e.g., redundant interconnections), or both.

Test and repair information 107 stored in non-volatile memory 105 of memory device 101 can be used to support testing and repairing of memory structure 103. Test and repair information 107 can include a combination of test information and repair information.

The test information 107 stored in non-volatile memory 105 can include test codes. The test codes can be used by an external device (e.g., by host device 102) to run a test for testing of memory structure 103. Results from the test may be used to determine whether memory structure 103 has a defective portion (e.g., additional defective portion) besides any known defective portion that may exist in memory structure 103.

The repair information 107 stored in non-volatile memory 105 can include a map indicating an address of a defective portion of memory structure 103. The repair information can also be used by an external device (e.g., by host device 102) to repair a defective portion of memory structure 103.

Testing of memory structure 103 can be performed at different times. For example, testing of memory structure 103 can include a test (e.g., probe test) performed on memory structure 103 before memory device 101 is coupled to (e.g., assembled with) host device 102 in an apparatus, such as apparatus 100. Testing of memory structure 103 can also include a test (e.g., field test, such as self-test) performed on memory structure 103 and conducted by host device 102 after memory device 101 is coupled to host device 102 in apparatus 100.

Test and repair information 107 stored in non-volatile memory 105 can be based on different test results, such as a test result from testing (e.g., probe test) of memory device 101 during manufacturing of memory device 101, a test result from testing (e.g., self-test) of memory device 101 after it is coupled to host device 102 in apparatus 100, or a combination of both test results.

Host device 102 can include a processor (e.g., a general purpose processor), an application-specific processor (e.g., application-specific integrated circuit (ASIC)), or other types of processors. Host device 102 can include a processing unit (e.g., a central processing unit (CPU)) 104 and a memory management unit 106. Processing unit 104 can include circuitry and modules to perform operations based on software instructions. The operations of processing unit 104 can include arithmetic and logical operations.

Memory management unit 106 can communicate with processing unit 104 through a connection 170. Connection 170 can include conductive connections on a substrate (e.g., a silicon-based substrate). Connection 170 can include an on-chip connection (e.g., one or more buses) between units of a system-on-chip. Memory management unit 106 can communicate with memory device 101 through connection 160.

Memory management unit 106 can perform a write operation to store information in memory structure 103 and a read operation to obtain information from memory structure 103. Memory management unit 106 can perform write and read operations in either a normal operating mode or a test mode of apparatus 100.

Memory management unit 106 can be arranged such that all information (e.g., user data and test data) exchanged between memory device 101 and host device 102 during read and write operations can be conducted through only memory management unit 106.

Memory management unit 106 and memory device 101 can operate in concert to test memory structure 103 and repair defective portions of memory structure 103. For example, memory management unit 106 can directly access non-volatile memory 105 to obtain test and repair information 107 for testing and repairing of memory structure 103. Memory management unit 106 can manage testing and repairing of memory structure 103 without processing unit 104 directly interacting with memory device 101.

Memory management unit 106 can modify (e.g., update) at least a portion of test and repair information 107 based on a test result from testing of memory structure 103 conducted by memory management unit 106. For example, if an additional portion of memory structure 203 is determined to be defective, memory management unit 106 can modify the repair information (e.g., updating the map of addresses of defective portions) included in test and repair information 107. The modified repair information can be used to support additional (e.g., subsequent) testing and repairing of memory structure 103.

Testing of memory structure 103 of memory device 101, initiated and conducted by host device 102 in the arrangement of a combination host device 102 and memory device 101 in apparatus 100, as described above, may be referred to as self-testing. Self-testing allows the combination of memory device 101 and host device 102 to control testing of memory structure 103 in an autonomous fashion (e.g., without using external test equipment).

One of ordinary skill in the art may realize that memory device 101 and host device 102 may include other elements, which are not shown in FIG. 1, so as not to obscure the example embodiments described herein.

Memory device 101 and host device 102 can include a memory device and a host device similar to, or identical to, those described below with reference to FIG. 2 through FIG. 10.

Figure 2:
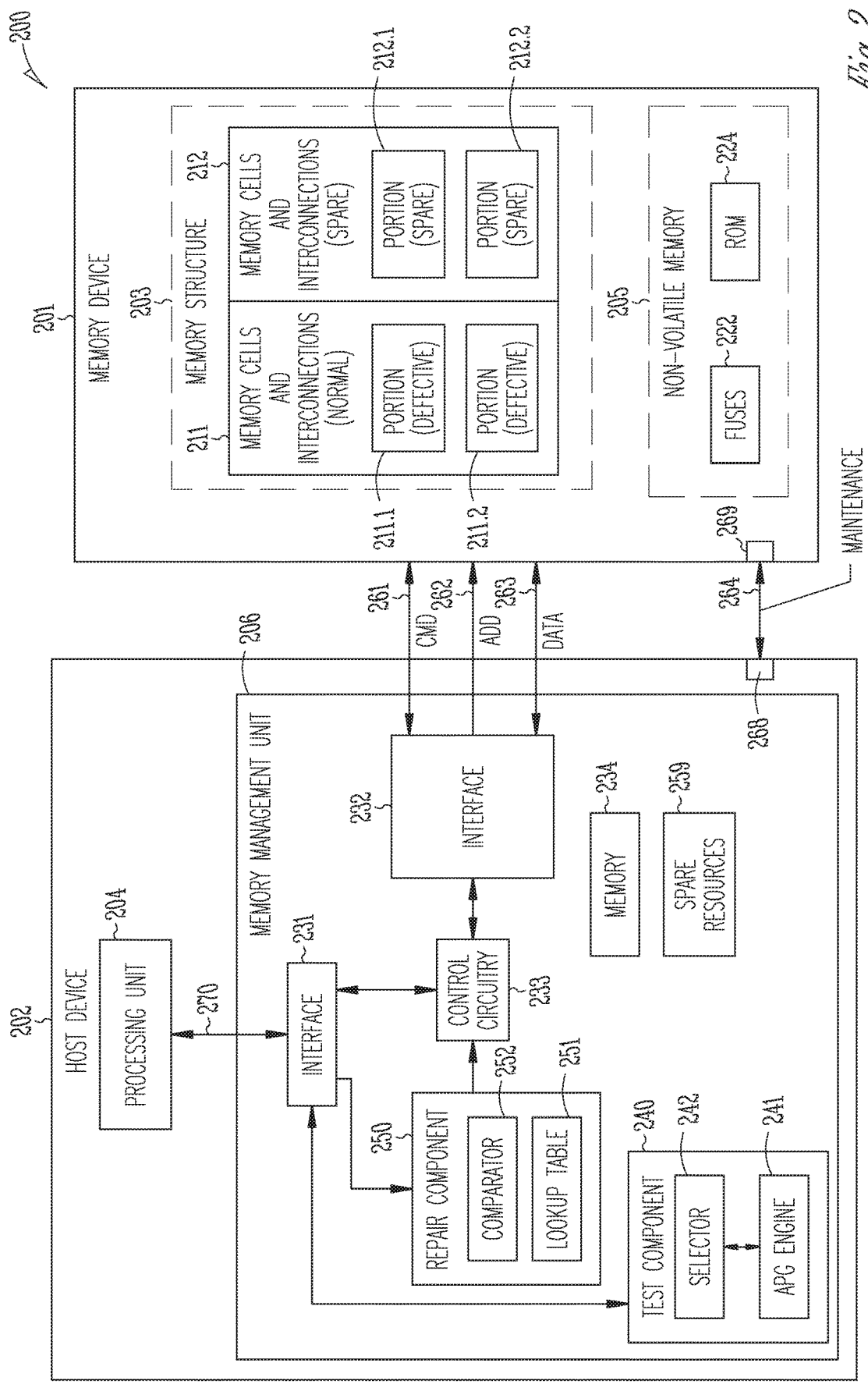
FIG. 2 shows a block diagram of an apparatus including a memory device having a non-volatile memory to store repair information and a host device having a memory management unit to communicate with the memory device, according to some embodiments described herein.

FIG. 2 shows a block diagram of an apparatus 200 including memory device 201 having a non-volatile memory 205 to store test and repair information, and host device 202 having a memory management unit 206 to communicate with memory device 201, according to some embodiments described herein. Memory device 201 and host device 202 can correspond to memory device 101 and host device 102, respectively, of FIG. 1.

As shown in FIG. 2, apparatus 200 can include connections 261, 262, 263, and 264 to allow memory device 201 and host device 202 to exchange (e.g., send and receive) information with each other. The combination of connections 261, 262, 263, and 264 can correspond to connection 160 between memory device 101 and host device 102 of FIG. 1. In FIG. 2, each of connections 261, 262, 263, and 264 can include one or more conductive paths (e.g., metal traces) on a printed circuit board or other kinds of electrical connections. The information on connections 261, 262, 263, and 264 can include commands (e.g., on connection 261), address (e.g., on connection 262), data (e.g., on connection 263), and other information, such as maintenance information (e.g., on connection 264).

The commands can include a command (e.g., a write command generated by host device 202) associated with storing (e.g., writing) information in memory structure 203 of memory device 201. The commands can also include a command (e.g., a read command generated by host device 202) associated with obtaining (e.g., sensing) information from memory structure 203. The commands can further include a command (e.g., a test mode command generated by host device 202) associated with testing (e.g., self-test) of memory device 201. Other commands can be communicated between memory device 201 and host device 202.

The address on connection 262 can include an address (e.g., address provided by host device 202) associated with one or more memory cells in memory structure 203. The data on connection 263 can include user data provided by host device 202 to be stored in memory structure 203 (e.g., during a write operation in a normal operating mode) or user data obtained from memory structure 203 (e.g., during a read operation in a normal operating mode) to be provided to host device 202.

The data on connection 263 can include test data provided by host device 202 (e.g., in a write operation in a test mode) to be stored in memory structure 203 during a test of memory device 201. The data on connection 263 can include data (e.g., stored test data) obtained from memory structure 203 (e.g., in a read operation in a test mode) to be provided to host device 202 during a test of memory device 201. Other information can be exchanged between memory device 201 and host device 202 through connection 264.

Memory device 201 can include a memory structure 203 having regions 211 and 212. Each of regions 211 and 212 can include memory cells to store information (e.g., data) and interconnections (e.g., signal paths) to carry information to and from the memory cells.

In region 211, the memory cells and interconnections can be configured (e.g., arranged, programmed, etc.) to operate as normal memory cells (e.g., functional memory cells) and normal interconnections (e.g., functional interconnections), such that the memory cells in region 211 can be organized into a memory space that can be recognized and accessed by host device 202.

In region 212, the memory cells and interconnections can be part of spare resources in apparatus 200. For example, memory cells and interconnections in region 212 can be configured to operate spare memory cells (e.g., redundant memory cells) and spare interconnections to replace a defective portion of memory structure 203.

A defective portion of memory structure 203 can include at least one memory cell, at least one interconnection, or a combination of both memory cells and interconnections that are deemed to be defective. For example, a defective portion of memory structure 203 can include only a single memory cell (e.g., a single defective memory cell in region 211) or multiple memory cells (e.g., multiple defective memory cells in region 211). A defective portion of memory structure 203 can include only a single interconnection (e.g., a single defective signal path in region 211) or multiple interconnections (e.g., multiple defective signal paths in region 211).

The memory cells in a defective portion of memory structure 203 may be located in a contiguous location (e.g., physically located next to each other) in memory structure 203 or may be located in non-contiguous locations (e.g., scattered in different locations) in memory structure 203.

Memory cells in regions 211 and 212 can be arranged in multiple memory arrays. The memory arrays can be located in different dice (e.g., semiconductor dice) included in memory device 201. The dice can be arranged in a stack, such that one die can be located (e.g., stacked) over one or more other dice in the stack. Each die among the dice can include a single memory array or multiple memory arrays. Interconnections in regions 211 and 212 can extend (e.g., vertically) from one die to another die in the stack. Interconnections in regions 211 and 212 can couple a memory array of a die in the stack to one or more other memory arrays of a different die (or dice) in the stack. Memory cells and interconnections in regions 211 and 212 of memory structure 203 can include memory cells and interconnections of a memory structure of a memory device described below with reference to FIG. 3 through FIG. 10. For example, memory structure 203 can include memory arrays and interconnection (e.g., signal paths) similar to, or identical to, those of a memory structure of a memory device describe below with reference to FIG. 4.

In FIG. 2, non-volatile memory 205 of memory device 201 can correspond to non-volatile memory 105 of FIG. 1. Non-volatile memory 205 can store test and repair information, which can be used to support testing and repairing of memory structure 203.

Non-volatile memory 205 can include a memory that can include programmable elements, such as fuses 222 and/or antifuses (not shown), and a memory that can include a read only memory (ROM) 224. Fuses 222 can be configured to store repair information for the repairing of defective portions of memory structure 203. Fuses 222 can also be configured to store other information, such as program control and subroutine call information that can be used by host device 202 for testing of memory structure 203. Storing information (e.g., repair information) in fuses 222 can include programming (e.g., by burning) a portion of fuses 222. The repair information in fuses 222 can include a map that may include the address of a defective portion of memory structure 203. The address of the defective portion of memory structure 203 can be determined based on test results from testing (e.g., probe test and self-test) of memory structure 203. The information stored in fuses 222 can be modified (e.g., modified by host device 202) more than one times based on test results from testing of memory structure 203.

As an example, FIG. 2 shows two portions 211.1 and 211.2 that may be determined to be defective based on test results from testing of memory structure 203 at different times. For example, portion 211.1 may be determined to be defective during a test (e.g., probe test) of memory structure 203 before memory device 201 is coupled host device 202. Portion 211.2 may be determined to be defective during a test (e.g., self-test) of memory structure 203 after memory device 201 is coupled to host device 202 (e.g., after a probe test has been performed on memory device 201). In this example, before the test (e.g., before the self-test) that determines portion 211.2 to be defective, fuse 222 may initially store repair information (e.g., a map of an address of a defective portion) that may include the address of only portion 211.1. After the initial repair information is stored in fuses 222, it can be modified (e.g., modified by host 202) to store an address of portion 211.2 (in addition to the address of portion 211.1). Based on the repair information stored in fuses 222, portions 211.1 and 211.2 can be replaced by portions 212.1 and 212.2, respectively. Thus, as described in herein, repair information stored in fuses 222 can include a combination of addresses of defective portions determined from different test results from testing (e.g., probe test and self-test) of memory structure 203 at different times.

The repair information stored in fuses 222 can be accessed and obtained (e.g., read) by host device 202. Host device 202 can operate to repair memory structure 203 based on the repair information. For example, host device 202 can operate to generate a repair lookup table based on repair information stored in fuses 222. Based on the repair lookup table, host device 202 can appropriately redirect an access to a defective portion to an access to another portion (e.g., a spare portion) that replaces the defective portion. Thus, during a write operation, host device 202 can replace accessing of a defective portion with accessing of a spare portion that replaces the defective portion, so that information can be stored in the spare portion instead of the defective portion. During a read operation, host device 202 can replace accessing of a defective portion operation with accessing of a spare portion that replaces the defective portion, so that information can be obtained from the spare portion instead of the defective portion.

ROM 224 can be configured to store test information. The test information can include test codes that can be used during a test (e.g., a self-test) for testing of memory structure 203. The test codes can include specific code structure (e.g., algorithmic pattern generator (APG) code structure) that can be used by test components of an external device (e.g., host device 202) to run a test for testing of memory structure 203. For example, the test information stored in ROM 224 can be accessed and obtained (e.g., read) by host device 202 and used by host device 202 for testing of memory structure 203. The information stored in ROM 224 may be static, such that it may remain unchanged after testing (e.g., after self-testing) of memory structure 203.

Memory device 201 can include a maintenance port 269 coupled to connection 264. Maintenance port 269 can be compatible with a Joint Test Action Group (JTAG) port. Maintenance port 269 may allow a device external to (e.g., physically separated from) memory device 201 (e.g., host device 202) to access and obtain the test and repair information stored in non-volatile memory 205. This test and repair information can be used for the repairing of memory structure 203, testing of memory structure 203, or both.

The combination of dynamic components (e.g., information stored in fuses 222, including program control and subroutine call information) and static components (e.g., information stored in ROM 224, including test codes) in non-volatile memory 205 may allow a flexible test arrangement. For example, the combination of static and dynamic components in non-volatile memory 205 may allow changes to be made to different types of testing of memory structure 203, such as probe tests and field tests (e.g., self-tests). Further, the combination of static and dynamic components in non-volatile memory 205 may also avoid creating additional ROM masks in memory device 201 (e.g., avoid creating an additional ROM mask for each additional change in test program used to test memory device 201).

Host device 202 can include a processing unit 204 and a memory management unit 206 that can correspond to processing unit 104 and memory management unit 106, respectively, of FIG. 1. Host device 202 can include a maintenance port 268 coupled to connection 264. Maintenance port 268 can be compatible with a JTAG port. Maintenance port 268 can be part of memory management unit 206, test component 240, processing unit 204, or other part of host device 202.

Memory management unit 206 may use maintenance port 268 (which is coupled to maintenance port 269 of memory device 201) to access and obtain test and repair information stored in non-volatile memory 205 of memory device 201. Memory management unit 206 can use the test repair information for the testing and repairing of memory structure 203 of memory device 201.

As shown in FIG. 2, memory management unit 206 can include an interface 231 to communicate with processing unit 204 through a connection 270. Connection 270 can correspond to connection 170 coupled between processing unit 104 and memory management unit 106 of FIG. 1. Memory management unit 206 can include an interface 232 to communicate with memory device 201 through connections 261, 262, and 263. Each of interfaces 231 and 232 can include circuit elements to send and receive information. For example, each of interfaces 231 and 232 can be include first-in-first-out (FIFO) circuitry, drivers, transmitters, receivers, and other circuit elements.

Memory management unit 206 can also include control circuitry 233, a memory 234, a test component 240, a repair component 250, and spare resources 259. FIG. 2 shows an example where test component 240 is included in memory management unit 206. In an alternative arrangement, part of test component 240 or the entire test component 240 may be located outside memory management unit 206 and within host device 202.

Control circuitry 233 can be programmed or otherwise configured to control and perform operations in memory management unit 206, as described herein. For example, control circuitry 233 can control the flow of information in memory management unit 206 during different operations. The operations in memory management unit 206 can include a write operation to store information (e.g., data) in memory structure 203, and a read operation to obtain information from memory structure 203. The read and write operations can be performed in a normal operating mode or in a test mode of apparatus 200. Thus, control circuitry 233 can control the flow of information during both a normal operating mode and a test mode of apparatus 200.

During read and write operations in a normal operating mode, the flow of information can include the flow of information between memory management unit 206 and processing unit 204 through interface 231, and the flow of information between memory management unit 206 and memory device 201 through interface 232. For example, during a write operation, control circuitry 233 can control the flow of information (e.g., write command, address and data provided processing unit 204) from interface 231 to interface 232. During a read operation, control circuitry 233 can control the flow of information (e.g., read data obtained from memory structure 203) from interface 232 to interface 231.

During read and write operations in a test mode, the flow of information can include the flow of information between test component 240 and memory device 201 (e.g., through interface 231 and interface 232). For example, during a write operation in a test mode, control circuitry 233 can control the flow of information (e.g., address and data provided by test component 240 for self-test) from test component 240 to memory structure 203 (e.g., from interface 231 to interface 232). During a read operation in a test mode, control circuitry 233 can control the flow of information (e.g., read data obtained from memory structure 203) from memory structure 203 to test component 240 (e.g., from interface 232 to interface 231).

Memory management unit 206 can maintain a record of spare resources (e.g., spare memory cells and spare interconnections in spare resources 259 of memory management unit 206 and region 212 of memory device 201) in apparatus 200. This record can include spare resources (e.g., 212 and 259) that have been used for repair and spare resources that are available for repair. This record can be stored in memory 234 of memory management unit 206. Memory 234 can also be configured to store a repair algorithm that may analyze available and unavailable spare resources to provide a decision in repairing a defective portion of memory structure 203.

Memory management unit 206 can repair a defective portion of memory structure 203 using spare resources 259. Spare resources 259 can include spare memory cells, spare interconnections, or both, that can be used to repair (e.g., replace) a defective portion of memory structure 203. As described above, spare resources (e.g., spare memory cells and spare interconnections) in region 212 of memory device 201 can be used to repair (e.g., replace) a defective portion of memory structure 203. Thus, in apparatus 200, a portion (e.g., spare portion) that replaces a defective portion can be included in memory device 201, in host device 202 (e.g., in memory management unit 206), or in both memory device 201 and host device 202.

Test component 240 can be used to test memory structure 203. Test component 240 can include an APG engine 241 and a selector 242. APG engine 241 can generate self-test information during a test mode for use in testing of memory structure 203 of memory device 201 in the test mode. The self-test information can include commands, test addresses, and test data. The commands can include commands (e.g., read and write commands) similar to, or identical to, those generated by processing unit 204 during a normal operating mode. The test addresses can include an address of a particular portion of memory structure 203 to be tested. The test data can include data having either a predetermined value or a random value (e.g., pseudo random value). The test data can to be stored (e.g., written) in the particular portion of memory structure 203 indicated by the test address. APG engine 241 can include an algorithm to cause the test data to be stored in memory structure 203 in specific patterns (e.g., predetermined patterns).

Selector 242 can be activated (e.g., enabled) during a test mode of apparatus 200 and deactivated (e.g., disabled) during a normal operating mode of apparatus 200. Selector 242 can include multiplexing circuitry that can selectively couple APG engine 241 to functional paths (e.g., write data path, read data path, and command path) of memory management unit 206. The functional paths can include functional paths between interfaces 231 and 232.

In a normal operating mode, the functional paths can be used to carry information between memory device 201 and processing unit 204. In a test mode, the functional paths can be used to carry information between memory device 201 and APG engine 241. For example, during a write operation in a normal operating mode, control circuitry 233 can select information (e.g., user data) from interface 231 (provided by processing unit 204) and send the information to interface 232 to be stored in memory structure 203. During a write operation in a test mode, control circuitry 233 can select information (e.g., test data) from APG engine 241 (instead of processing unit 204) and send the information to interface 232 to be stored in memory structure 203.

In another example, during a read operation in a normal operating mode, control circuitry 233 can select information (e.g., user data) from interface 232 (provided by memory structure 203) and send the information to interface 231 to be provided to processing unit 204. During a read operation in a test mode, control circuitry 233 can select information (e.g., test data) from interface 232 (provided by memory structure 203) and send the information to interface 231 to be provided to APG engine 241.

Repair component 250 can be used to repair memory structure 203. Repair component 250 can include a lookup table 251 and a comparator 252. Lookup table 251 can include repair information associated with a defective portion of memory structure 203. Memory management unit 206 can use the repair information in lookup table 251 to appropriately access memory structure 203 during memory operations such as write and read operations.

Memory management unit 206 can generate the content of lookup table 251 based on the repair information. Memory management unit 206 can access non-volatile memory 205 and obtain repair information stored in fuses 222. Thus, lookup table 251 can have content generated based on the repair information obtained from non-volatile memory 205 of memory device 201. The content in lookup table 251 can include a mapping of an address associated with a defective portion of memory structure 203 to an address associated with a spare portion that replaces the defective portion. The addresses stored in lookup table 251 can include row and column addresses of a memory cell (or memory cells) in a defective portion. The addresses stored in lookup table 251 can also include row and column addresses of a memory cell (or memory cells) in a spare portion that replaces a defective portion.

Based on the content (e.g., mapping of the addresses) of lookup table 251, memory management unit 206 can redirect access to a defective portion to access to a spare portion. For example, memory management unit 206 can replace accessing of a defective portion with accessing of a spare portion that replaces the defective portion, so that information can be stored in the spare portion instead of the defective portion. During a read operation, memory management unit 206 can replace accessing of a defective portion operation with accessing of a spare portion that replaces the defective portion, so that information can be obtained from the spare portion instead of the defective portion.

In each memory operation (e.g., each write or each read operation), memory management unit 206 may compare an incoming address (e.g., received at interface 231) with an address included in lookup table 251. The incoming address can include an address associated with a portion of memory structure 203 to be accessed. The incoming address can be provided by either processing unit 204 (e.g., during a normal operating mode) or AGP 241 (e.g., during a test mode). Lookup table 251 can be configured (e.g., store an address of a defective portion) such that if the incoming address matches an address in lookup table 251, then memory management unit 206 can determine that the incoming address is associated with the defective portion. Memory management unit 206 can be configured to access a spare portion (instead of the defective portion associated with the incoming address) if the incoming address matches an address in lookup table 251. Memory management unit 206 can be configured to access a portion associated with the incoming address if the incoming address does not match an address in lookup table 251.

Comparator 252 can include circuitry to compare an incoming address with an address in lookup table 251. The results from the comparison by comparator 252 can determine whether or not the incoming address matches an address in lookup table 251. Comparator 252 can operate in both the normal operating mode and the test mode to compare addresses.

Memory management unit 206 or processing unit 204 can be configured to initiate a test mode in apparatus 200 to start a test (e.g., self-test) for testing of memory structure 203. The test mode (e.g., self-test mode) can be initiated each time apparatus 200 is powered-on, periodically at some fixed time interval, during low activities or inactivity period in apparatus 200 (e.g., during a period of no read or write being performed in a normal operating mode), or other conditions in apparatus 200. One of such conditions may include memory management unit 206 or processing unit 204 initiating a test mode based on errors detected in information obtained from memory structure 203. For example, memory structure 203 may include error correction code (ECC) data associated with information stored in memory structure 203. The ECC data may be generated by memory device 201 or by memory management unit 206 (or another part of host device 202). The ECC data may allow detection and correction of errors that may occur in information obtained from memory structure 203 during a memory operation (e.g., a read operation in a normal operating mode). An error indication (e.g., an error flag) associated with detected errors may be generated (e.g., generated by memory device 201 or by memory management unit 206). Based on the error indication (e.g., if the error indication is generated as a result of detected errors), memory management unit 206 or processing unit 204 can initiate a test mode in apparatus 200 to start a test (e.g., self-test) for testing and repairing of memory structure 203.

The following description gives an example test operation (e.g., self-test) for testing of memory structure 203 in apparatus 200. As described above, either processing unit 204 or memory management unit 206 can initiate the test to put apparatus in a test mode. In the test mode, memory management unit 206 can perform write and read operations that can be similar to normal operating write and read operations that memory management unit 206 performs. However, memory management unit 206 may use self-test information (e.g., commands, test addresses, and test data) generated by APG engine 241 of test component 240 instead of using information generated by processing unit 204.

In a test mode (e.g., self-test mode), memory management unit 206 can access non-volatile memory 205 and obtain test information (e.g., test codes) and repair information (e.g., an address associated with a defective portion) from non-volatile memory 205. APG engine 241 can generate self-test information (e.g., commands, test addresses, and test data). The memory management unit 206 can send test data to interface 232 in a write operation in the test mode. Memory device 201 can receive the test data and store it in memory structure 203 as stored test data.

In a read operation in the test mode (e.g., performed after a write operation in the test mode), memory device 201 can obtain (e.g., read) the stored test data from memory structure 203 and send the stored test data to memory management unit 206 of host device 202 through interface 232. Memory management unit 206 of host device 202 can receive the stored test data from interface 232. Based on the stored test data (received from memory device 201) memory management unit 206 can generate a test result based at least in part on the stored test data. The test result may allow memory management unit 206 to determine (e.g., using test component 240) whether memory structure 203 of memory device 201 has a defective portion (e.g., additional defective portion) besides any known defective portion that may exist in memory structure 203. As described above, a defective portion can include memory cells, interconnections, or a combination of both. The test result may allow memory management unit 206 to determine whether a memory cell, an interconnection, or both is defective.

To determine whether memory structure 203 has an additional defective portion, memory management unit 206 may be configured to compare stored test data received from memory device 201 (e.g., in a read operation in a test mode) with test data sent to memory device 201 (e.g., in a write operation in a test mode). This comparison can include a bit-wise comparison and can be performed by test component 240 (e.g., by APG engine 241) or by another component in memory management unit 206. Alternatively, based on the test data (sent to memory device 201) and the stored test data (received from memory device 201), memory management unit 206 of host 202 can use other techniques (e.g., using error correction codes) to determine whether memory structure 203 has an additional defective portion.

Management unit 206 can perform a repair operation for repairing a portion of memory structure 203 determined to be defective. The following repair example assumes that the example test operation (described above) determines that, in addition to portion 211.1 known to be defective before the test, portion 211.2 of memory structure 203 is also determined to be defective based on the result from the test.

In the example repair operation, memory management unit 206 can access non-volatile memory 205 of memory device 201 to modify repair information stored (in fuses 222) in non-volatile memory 205. The information stored in non-volatile memory 205 may include an address of only a defective portion known before the test (e.g., the address of only portion 211.1). Modifying non-volatile memory 205 after the test may include updating the repair information to include additional repair information (e.g., address) associated with portion 211.2 (e.g., additional defective portion). In the example test and repair operations described herein, memory management unit 206 may send an address associated with portion 211.2 to memory device 201. Memory device 201 can store this address in fuses 222. Thus, after the repair information in non-volatile memory 205 is modified (e.g., updated), the modified repair information may include the addresses of both portions 211.1 and 211.2 (e.g., defective portions).

Memory management unit 206 may also use the modified repair information to modify (e.g., update) lookup table 251, so that lookup table 251 can include the addresses of both portions 211.1 and 211.2. This may allow memory management unit 206 to properly redirect information to and from each of portions 211.1 and 211.2 (e.g., in a read or write operation in a normal operating mode), such as by replacing accessing of portions 211.1 and 211.2 with accessing of spare portions (e.g., 212.1 and 212.2 respectively) that replace portions 211.1 and 211.2. As describe above, spare portions in apparatus 200 (e.g., in spare resources 259 or in region 212) can include memory cells, interconnections, or a combination of both. Thus, the spare portion that replaces portion 211.1 or 211.2 can be used to replace a defective memory cell (or memory cells), interconnection (or interconnections), or a combination of both.

The combination of dynamic components in memory device 201 (e.g., fuses 222 and information stored therein), static components in memory device 201 (e.g., ROM 224 and information stored therein), test components external to memory device 201 (test component 240 including APG engine 241), and spare resources (e.g., 259 and 212), as described above, may allow a cost effective and flexible test solution for testing (e.g., self-test) of memory structure 203 of memory device 201.

Figure 3:
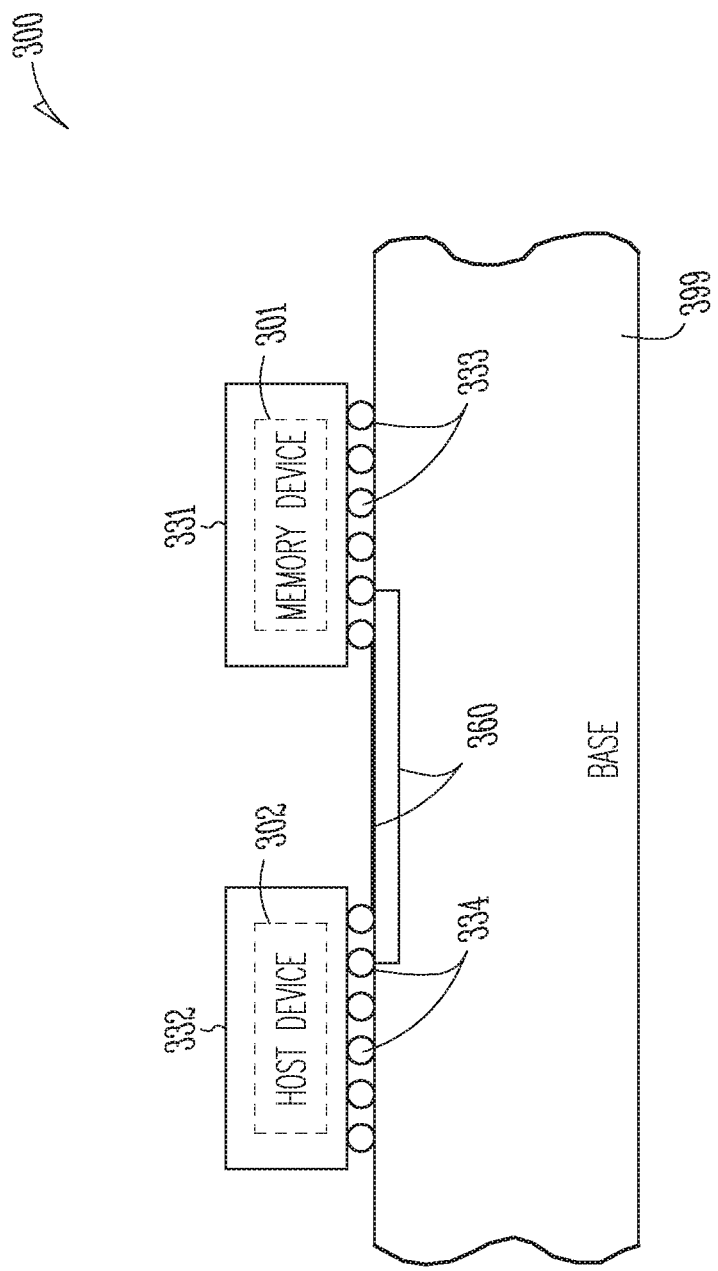
FIG. 3 shows a side view of a portion of an apparatus including a memory device and a host device arranged over a base, according to some embodiments described herein.

FIG. 3 shows a side view of a portion of an apparatus 300 including a memory device 301 and host device 302 arranged over a base 399, according to some embodiments described herein. Memory device 301 and host device 302 can be configured to include circuit elements and operations similar to, or identical to, that of memory device 101 and host device 102, respectively, of FIG. 1, or memory device 201 and host device 202, respectively, of FIG. 2.

As shown in FIG. 3, apparatus 300 can include a die 331, and a die 332 separated from die 331. Each of dice 331 and 332 can include a semiconductor die (e.g., a silicon die). Die 331 can be included in an integrated circuit (IC) package. Die 332 can be included in another IC package physically separated from the IC package that includes memory device 301. As shown in FIG. 3, memory device 301 can be included in die 331 (e.g., die 331 can include circuitry that forms memory device 301). Memory device 301 can be included in only a single die (e.g., die 331). Alternatively, memory device 301 can be included in multiple dice, in which the dice can be arranged side-by-side (e.g., horizontally with respect to the surface of base 390) and/or can be arranged in a stacked relationship (e.g., vertically with respect to the surface of base 390). Host device 302 can be included in die 332 (e.g., die 332 can include circuitry that form host device 302).

Base 399 can include an organic base (e.g., a printed circuit board or other types of structures) or other non-silicon based material. Alternatively, base 399 can include a silicon-based material (e.g., a silicon interposer).

Base 399 can include a connection 360 to provide communication (e.g., carry signals) between memory device 301 and host device 302. Connection 360 can correspond to a combination of connections 261, 262, 263, and 264 between memory device 201 and host device 202 of FIG. 2. In FIG. 3, connection 360 can include conductive paths, which can include conductive traces (e.g., copper traces). As shown in FIG. 3, a portion (e.g., a group of conductive paths) of connection 360 can be disposed over (e.g., over the surface)

base 399, and another portion (e.g., another group of conductive paths) of connection 360 can be disposed inside base 399.

Memory device 301 can include connections 333 coupled to connection 360. Host device 302 can include connections 334 coupled to connection 360. Connections 333 and 334 can include solder balls, conductive pins, or other conductive connections.

FIG. 3 shows an example where memory device 301 and host device 302 are arranged side-by-side. In an alternative arrangement, memory device 301 and host device 302 can be arranged in a stack, such that host device 302 can be directly below memory device 301 (e.g., directly below memory device 301 and between memory device 301 and base 399), for example.

Figure 4:
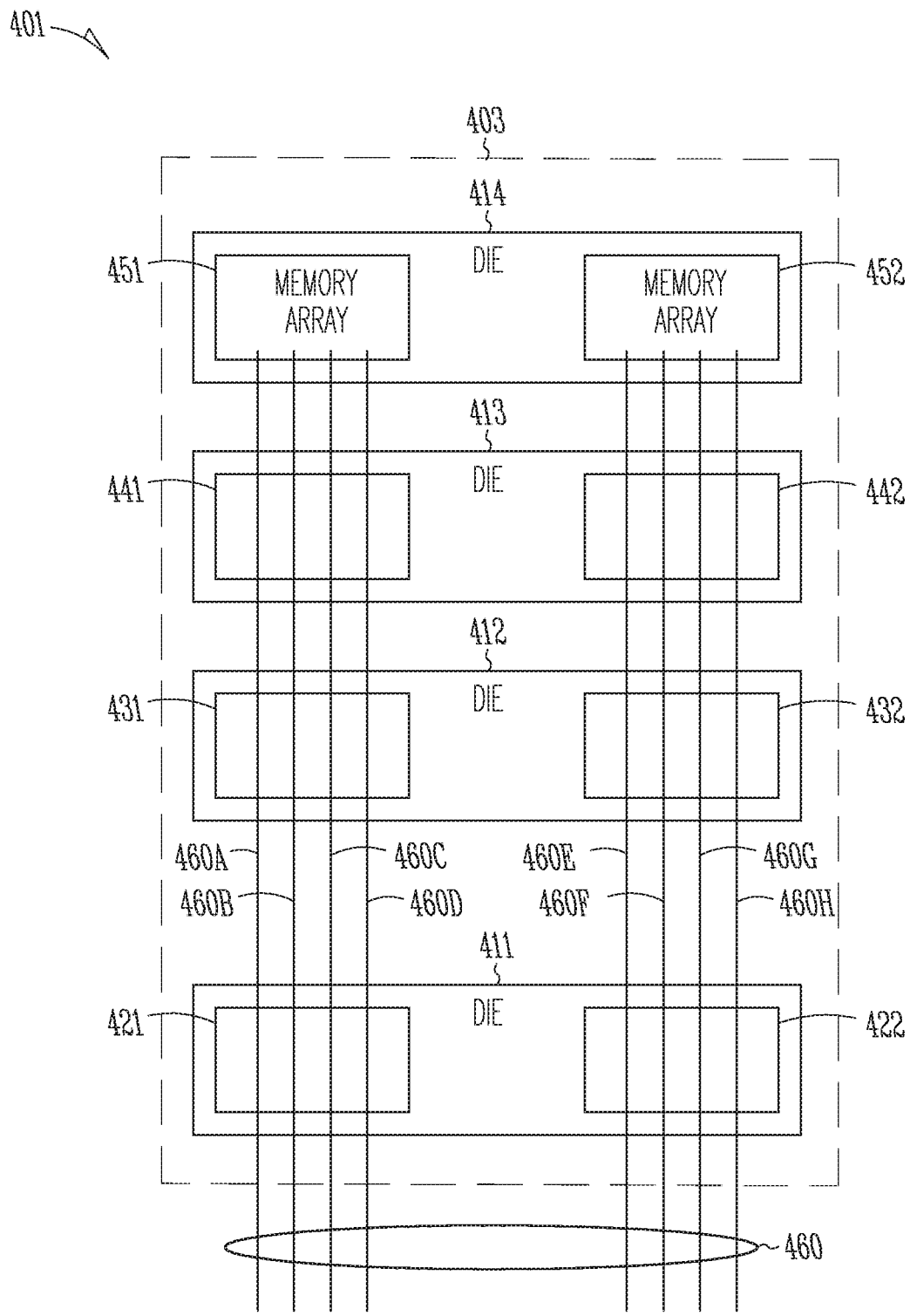
FIG. 4 shows a block diagram of a memory device including dice and a connection extending through the dice, according to some embodiments described herein.

FIG. 4 shows a block diagram of a memory device 401 including dice 411, 412, 413, and 414 and a connection 460 extending through the dice, according to some embodiments described herein. Memory device 401 can be configured to include circuit elements and operations similar to, or identical to, those of memory device 101 (FIG. 1) or memory device 201 (FIG. 2).

As shown in FIG. 4, dice 411, 412, 413, and 414 and connection 460 can be part of a memory structure 403, which can correspond to memory structure 103 (FIG. 1) or memory structure 203 (FIG. 2). Connection 460 can be part of a connection (e.g., similar to, or identical to, the combination of connections 261, 262, 263, and 264) that is used to couple memory device 401 to another device, such as to a host device that can similar to, or identical to, host device 102 (FIG. 1) or host device 202 (FIG. 2).

As shown in FIG. 4, each of dice 411, 412, 413, and 414 can include multiple memory arrays of memory cells, such as memory arrays 421, 422 included in die 411, memory arrays 431, 432 included in die 412, memory arrays 441, 442 included in die 413, and memory arrays 451, 452 included in die 414.

Connection 460 can include signal paths 460a through 460h extending (e.g., vertically) through dice 411, 412, 413, and 414 and coupled to the memory arrays of each of dice 411, 412, 413, and 414. This may allow the memory arrays of different dice (among dice 411, 412, 413, and 414) to share the same signal paths of connection 460. For example, arrays 421, 431, 441, and 451 can share signal paths 460a, 460b, 460c, and 460d. Arrays 422, 432, 442, and 452 can share signal paths 460e, 460f, 460g, and 460h. Some or all of signal paths 460a through 460h can physically extend through at least one die among dice 411, 412, 413, and 414 (e.g., extending from one surface of the die to another surface of the die).

FIG. 4 shows an example where memory device 401 can have four dice 411, 412, 413, and 414, and each of the dice can have two memory arrays. The number of dice and the number of memory arrays in each die can vary. FIG. 4 also shows an example where connection 460 includes eight signal paths 460a through 460h. The number of signal paths of connection can vary. For example, connection 460 can include hundreds or thousands of signal paths similar to signal paths 460a through 460h.

Some of the signal paths of connection 460 can be used as spare signal paths to replace other signal paths of connection 460 that are determined to be defective. For example, if a result from testing of memory structure 403 determines that signal path 460a is defective, a spare signal path (e.g., 460d) can be used to replace signal path 460a. In this example, information (e.g., in a read or write operation) intended to be carried on signal path 460a can be redirected to signal path 460d. Testing of memory structure 403 can be similar to, or identical to, that of testing of memory structure 103 (FIG. 1) or memory structure 203 (FIG. 2) described above.

Figure 5:
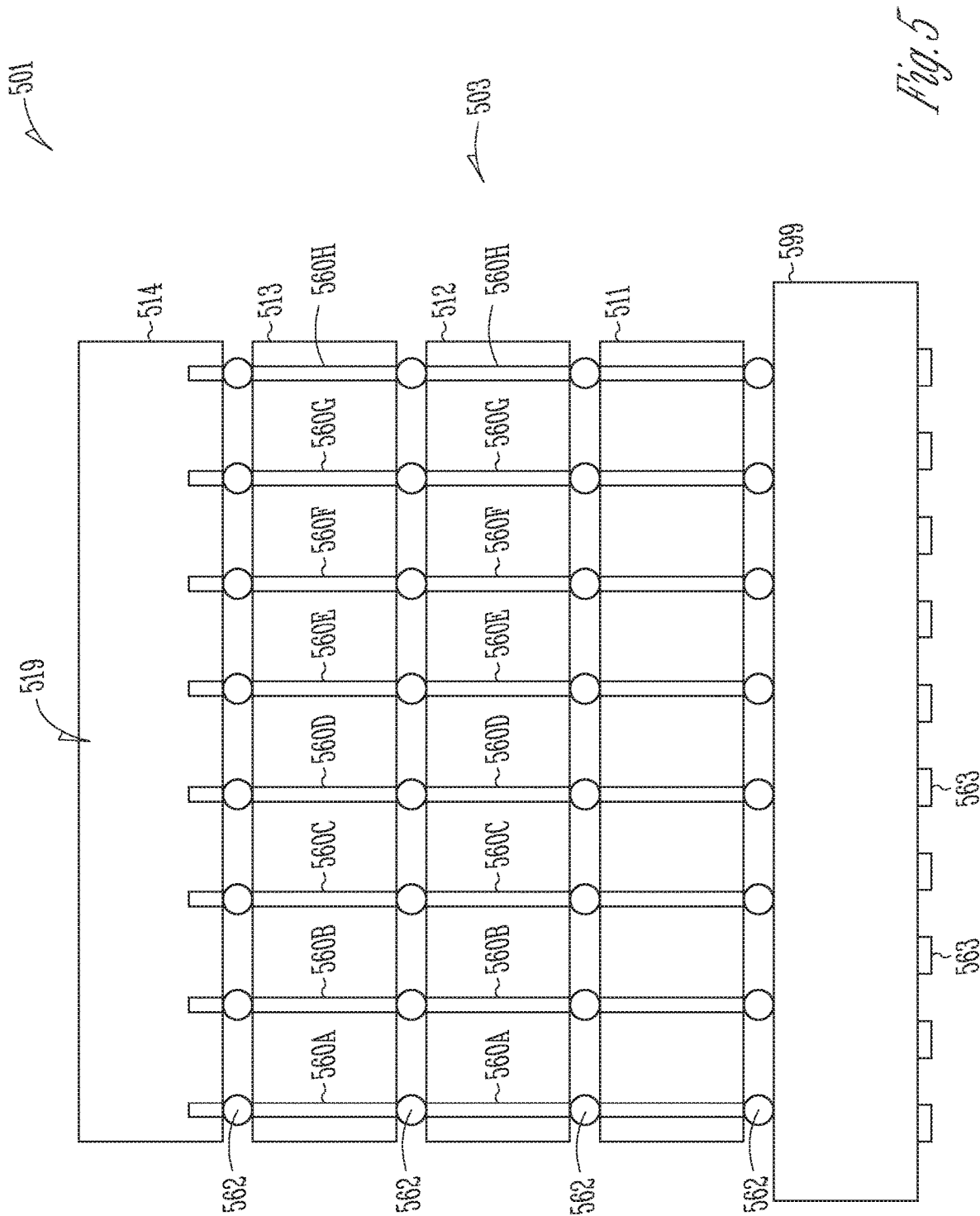
FIG. 5 shows a side view of a memory device including dice arranged in a stack and signal paths extending through the dice, according to some embodiments described herein.

FIG. 5 shows a side view of a memory device 501 including dice 511, 512, 513, and 514 arranged in stack 519 and signal paths extending through the dice, according to some embodiments described herein. Memory device 501 can include circuit elements and operations similar to, or identical to, those of memory device 101 (FIG. 1), memory device 201 (FIG. 2), or memory device 401 (FIG. 4). Some of the elements of memory device 501 are omitted from FIG. 5 to concentrate on the stack structure and the structure of signal paths formed by vias 560a through 560h.

As shown in FIG. 5, dice 511, 512, 513, and 514 can be arranged in a stack 519 one over another (e.g., in a vertical direction) over a support 599. In an alternative arrangement, support 599 can be omitted. Support 599 can include a silicon-based material or other materials. Stack 519 can be part of a memory structure 503 of memory device 501. Memory structure 503 can be implemented in memory device 101 as memory structure 103, implemented in memory device 201 as memory structure 203, or implemented in memory device 401 as memory structure 403. FIG. 5 shows an example where memory device 501 includes four dice arranged in stack 519. The number of dice in stack 519 can vary.

Memory device 501 can include vias 560a through 560h, which can be part of signal paths (similar to signal path 460a through 460h of FIG. 4) to carry information (e.g., in the form of signals) to and from dice 511, 512, 513, and 514. Vias 560a through 560h can extend from one surface of the die to the opposite surface of the die. Each of dice 511, 512, 513, and 514 can include a substrate. Thus, vias 560a through 560h can be referred to as through-substrate vias. The substrates of dice 511, 512, 513, and 514 can include a silicon or a silicon-based substrate. Thus, vias 560a through 560h can be referred to as through-silicon vias.

Vias 560a through 560h of one die can be coupled to respective vias 560a through 560h of another die using conductive joints 562 arranged pair-wise between dice 511, 512, 513, and 514. Joints 562 can include solder, copper, a conductive adhesive, or other electrical conductive materials. Some of joints 562 can also be coupled to support 599.

Memory device 501 can also include contacts 563, which can be coupled to joints 562 through conductive elements (not shown) in support 599; such conductive elements may include vias (e.g., through-silicon vias). Contacts 563 can be part of a connection that allows memory device 510 to be coupled to another device. For example, contacts 563 can be part of a connection similar to, or identical to, connection 160 (FIG. 1), connection 260 (FIG. 2), or connection 460 (FIG. 6) to allow memory device 501 connect to a host device, such as host device 102 (FIG. 1) or host device 202 (FIG. 2).

Support 599 may include a semiconductor package substrate, a ceramic package substrate, an organic package substrate, or another package substrate appropriate for the configuration of stack 519. Stack 519 may be formed using techniques such as "flip-chip" or other techniques.

Figure 6:
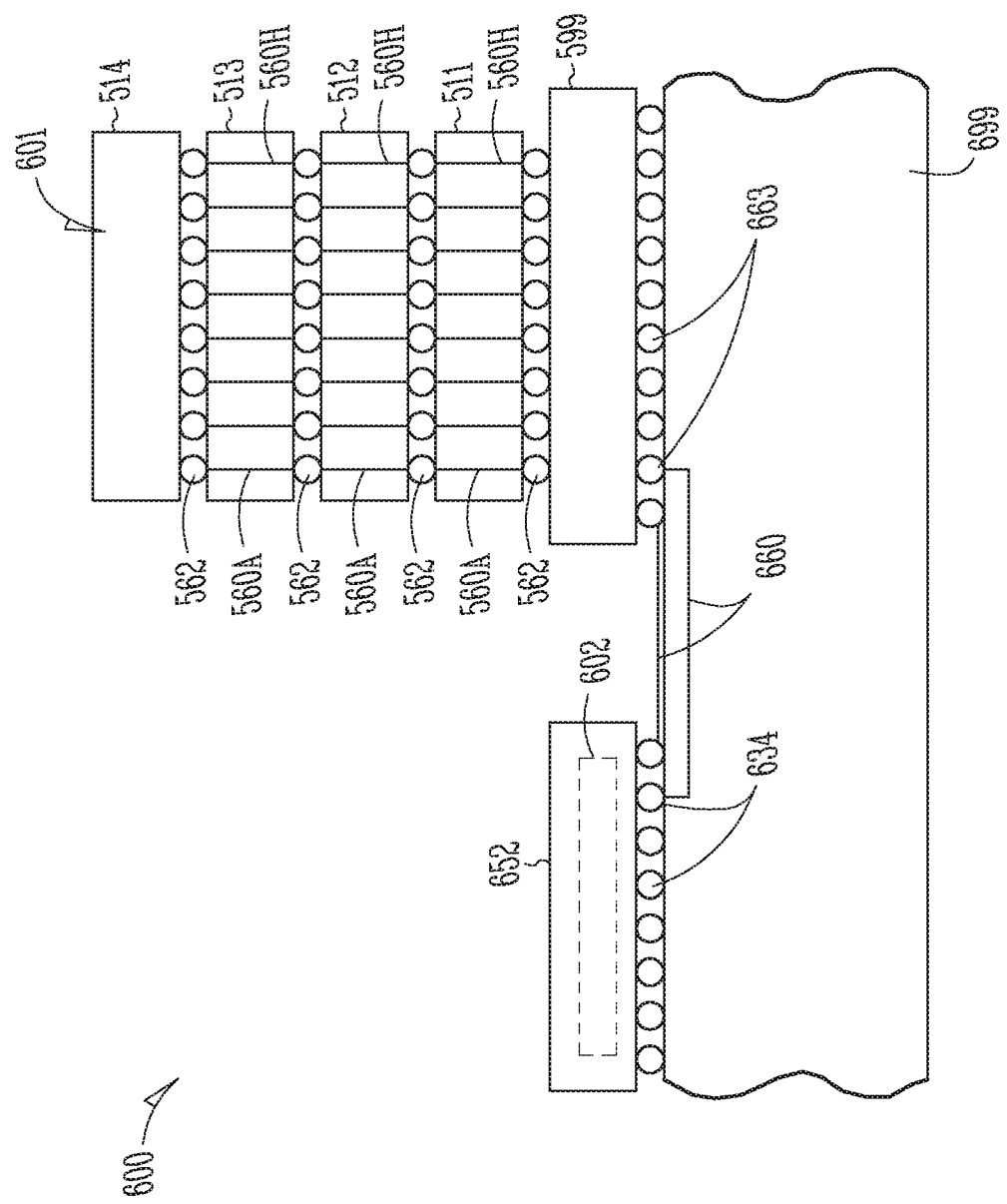
FIG. 6 shows a side view of a portion of an apparatus including a memory device having dice arranged in a stack and a host device coupled to the memory device, according to some embodiments described herein.

FIG. 6 shows a side view of a portion of an apparatus 600 including a memory device 601 having dice arranged in a stack, and a host device 602 coupled to memory device 601, according to some embodiments described herein. Memory device 601 and host device 602 can be configured to include circuit elements and operations similar to, or identical to, that of memory device 101 and host device 102, respectively, of FIG. 1, or memory device 201 and host device 202, respectively, of FIG. 2. Memory device 601 can also correspond memory device 401 (FIG. 4) or memory device 501 (FIG. 5).

As shown in FIG. 6, memory device 601 can include elements similar to, or identical to, memory device 501. Thus, for simplicity, similar or identical elements between memory devices 501 and 601 are not repeated in the description of FIG. 6.

Apparatus 600 can include a die 652. Host device 602 can be included in die 652 (e.g., die 652 can include circuitry that forms host device 602). Die 652 can be included in an IC package. Memory device 601 can be included in another IC package physically separated from the IC package that includes die 652.

Apparatus 600 can include a base 699. Base 699 can include a printed circuit board or other types of structures. Base 699 can include a connection 660 to provide communication between host device 602 and memory device 601. Connection 660 can correspond to connection 160 (FIG. 1), connection 260 (FIG. 2), or connection 460 of FIG. 4. As shown in FIG. 6, memory device 601 can include connections 663 coupled to connection 660. Connections 663 can include contacts 563 (FIG. 5) of memory device 501. Host device 602 in FIG. 6 can include connections 634 coupled to connection 660. Connections 663 and 634 can include solder balls, conductive pins, or other conductive connections. Connection 660 of base 699 can include conductive paths to carry signals between memory device 601 and host device 602. Connection 660 can include conductive traces (e.g., copper traces). As shown in FIG. 6, a portion (e.g., a group of conductive paths) of connection 660 can be disposed over (e.g., over the surface) base 699 and another portion (e.g., another group of conductive paths) of connection 660 can be disposed inside base 699.

Figure 7:
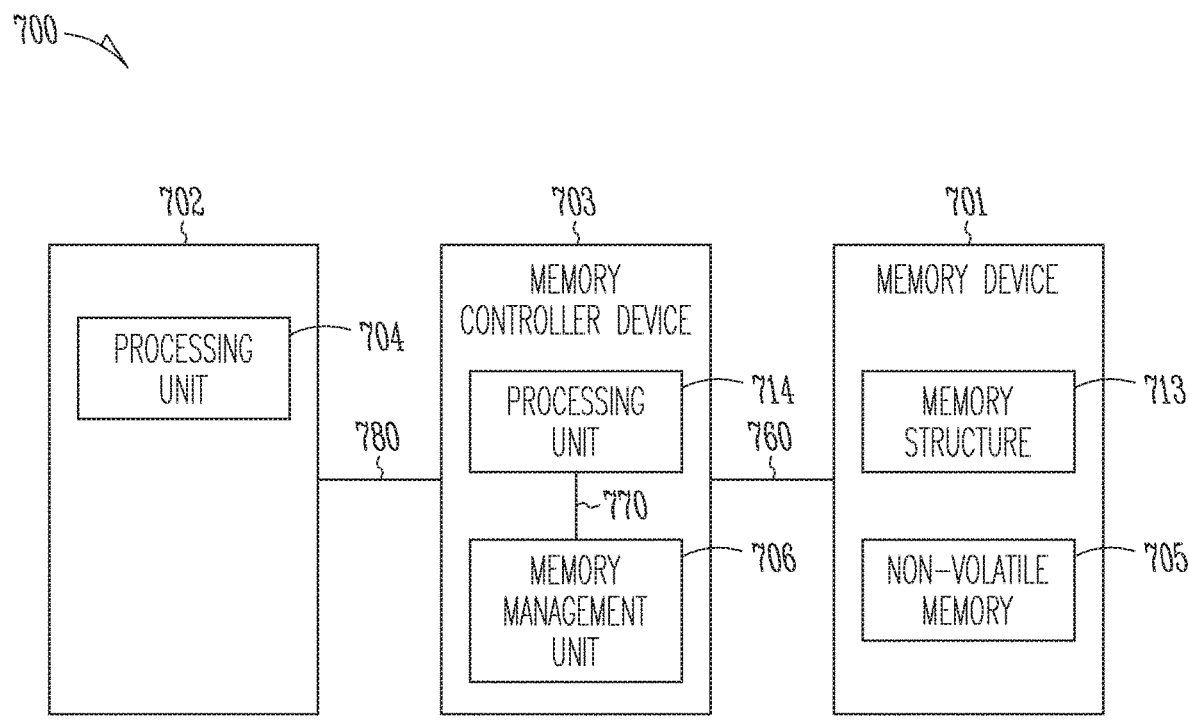
FIG. 7 shows a block diagram of an apparatus including a memory device, a host device, and a memory controller, according to some embodiments described herein.

In the embodiments described above with reference to FIG. 1 through FIG. 6, a host device operates as a memory controller device. Thus, a host device described above with reference to FIG. 1 through FIG. 6 can also be considered a "memory controller device". In other embodiments, separate devices may perform the host device functionality and the memory controller device functionality. For example, FIG. 7 shows a block diagram of an apparatus 700 including a memory device 701, a host device 702, and a memory controller device 703, according to some embodiments described herein. Memory device 701 can include elements and operations similar to, or identical to, those of memory devices described above with reference to FIG. 1 through FIG. 6, such as memory devices 101, 201, 301, 401, 501, and 601. For example, memory device 701 can include a memory structure 713 and a non-volatile memory 705 that can include elements and operations similar to, or identical to, those of memory structure 103 and a non-volatile memory 105, respectively, of memory device 101 (FIG. 1) or memory structure 203 and a non-volatile memory 205, respectively, of memory device 201 (FIG. 2).

Memory controller device 703 can include a processing unit 714 coupled to a memory management unit 706 through a connection 770. Memory device 701 and memory controller device 703 can communicate with each other through a connection 760. Connections 760 and 770 can correspond to connections 160 and 170, respectively, of FIG. 1, or connections 260 and 270, respectively, of FIG. 2.

Memory management unit 706 and memory device 701 can be configured to perform repairing and testing of memory structure 713 in a fashion similar to or identical to those of memory management unit 106 and memory device 101, respectively, of FIG. 1, or memory management unit 206 and memory device 101, respectively, of FIG. 2. Thus, memory management unit 706 can be configured to control a flow of information to and from the memory device 701, such that addresses and data sent to and received from memory device 701 are conducted through only memory management unit 706 of memory controller device 703.

Memory controller device 703 can control the flow of information between host device 702 and memory device 701. Host device 702 can include a processor. However, memory management unit 706 can be configured to control a flow of information to and from the memory device 701, such that addresses and data sent to and received from memory device 701 are conducted through only memory management unit 706 of memory controller device 703

Figure 8:
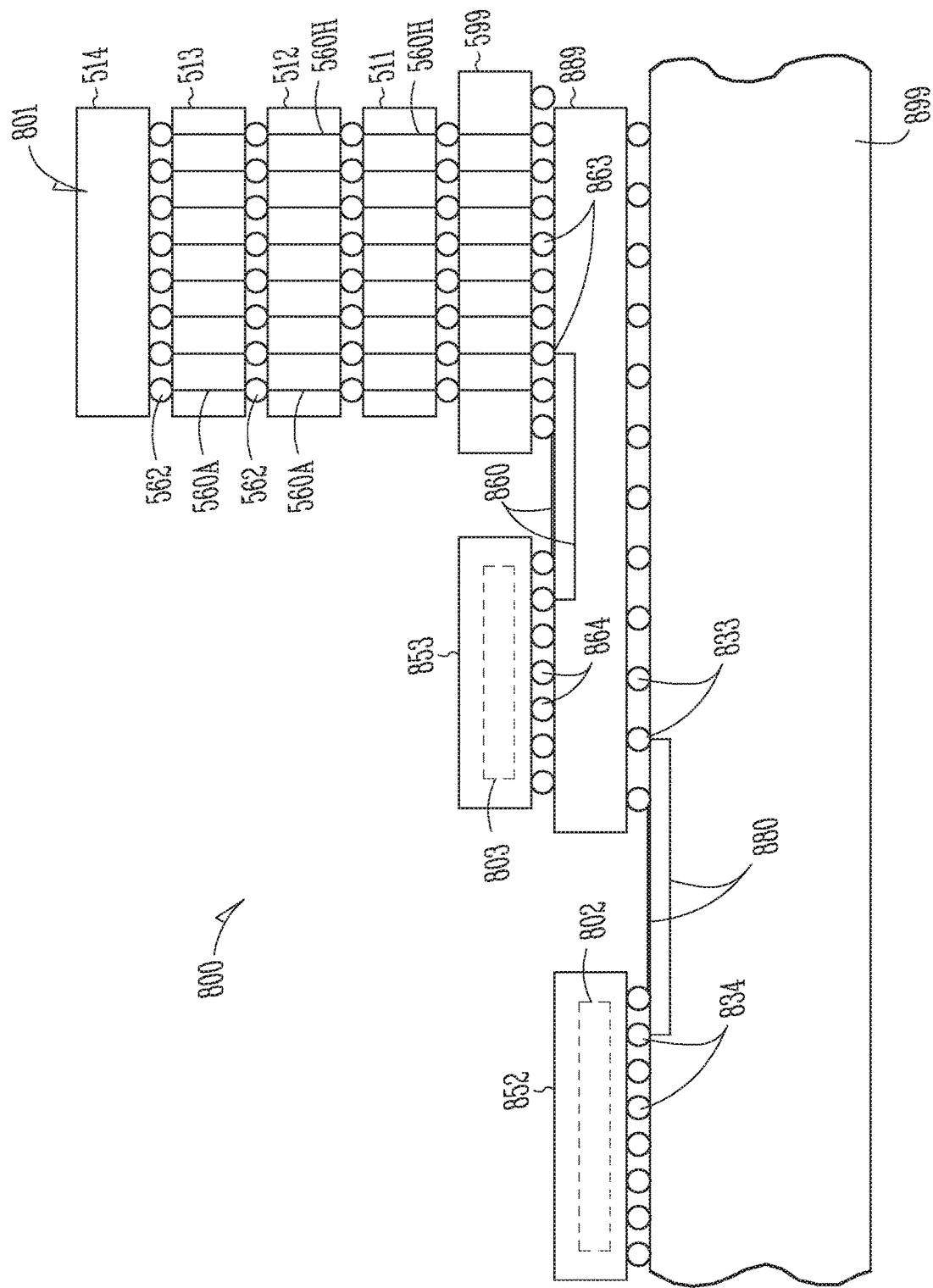
FIG. 8 shows a side view of a portion of an apparatus including a memory device, a host device, and a memory controller device arranged over a base, according to some embodiments described herein.

FIG. 8 shows a side view of a portion of an apparatus 800 including a memory device 801, a host device 802, and a memory controller device 803 arranged over a base 899, according to some embodiments described herein. Memory device 801 can include elements similar to, or identical to, memory device 501 (FIG. 5). Thus, for simplicity, similar or identical elements between memory devices 501 and 801 are not repeated in the description of FIG. 8.

Memory device 801, host device 802, and memory controller device 803 can be configured to include circuit elements and operations similar to, or identical to, that of memory device 701, host device 702, and memory controller device 703 FIG. 7.

As shown in FIG. 8, apparatus 800 can include a die 852 separated from a die 853. Host device 802 can be included in a die 852. Memory controller device 803 can be included in a die 853. Memory controller device 803 can be arranged over a base 889 and side-by-side with the memory device 801.

Memory device 801 can be included in an IC package. Memory controller device 803 can be included in another IC package separated from the IC that includes memory device 801. Alternatively, memory device 801 and memory controller device 803 can be included in the same IC package. Die 852 (which includes host device 802) can be included in an IC package separated from the IC package that includes memory device 801 and from the IC package that includes memory controller device 803. Alternatively, host device 802 and memory controller device 803 can be included in the same IC package.

Base 889 can include a silicon-based material (e.g., a silicon interposer) or other materials or structures. Base 889 can include a connection 860 to provide communication (e.g., carry signals) between memory device 801 and memory controller device 803. Connection 860 can correspond to connection 760 between memory device 701 and memory controller device 703 of FIG. 7. In FIG. 8, connection 860 can include conductive paths, which can include conductive traces (e.g., copper traces). As shown in FIG. 8, a portion (e.g., a group of conductive paths) of connection 860 can be disposed over (e.g., over the surface) of base 889 and another portion (e.g., another group of conductive paths) of connection 860 can be disposed inside base 889.

Apparatus 800 can include connections 863 coupled to connection 860 and formed between support 599 and base 889. Connections 863 can include contacts 563 (FIG. 5) of memory device 501. In FIG. 8, memory controller device 803 can include connections 864 coupled to connection 860. Connections 863 and 864 can include solder balls, conductive pins, or other conductive connections.

Base 899 can include a printed circuit board or other types of structures. Base 899 can include a connection 880 to provide communication (e.g., carry signals) between host device 802 and memory controller device 803. Connection 880 can correspond to connection 780 between host device 702 and memory controller device 703 of FIG. 7. In FIG. 8, connection 880 can include conductive paths, which can include conductive traces (e.g., copper traces). As shown in FIG. 8, a portion (e.g., a group of conductive paths) of connection 880 can be disposed over (e.g., over the surface) of base 899 and another portion (e.g., another group of conductive paths) of connection 880 can be disposed inside base 899.

Apparatus 800 can include connections 833 coupled to connection 880 and formed between base 889 and base 899. Host device 802 can include connections 834 coupled to connection 880. Connections 833 and 834 can include solder balls, conductive pins, or other conductive connections.

Figure 9:
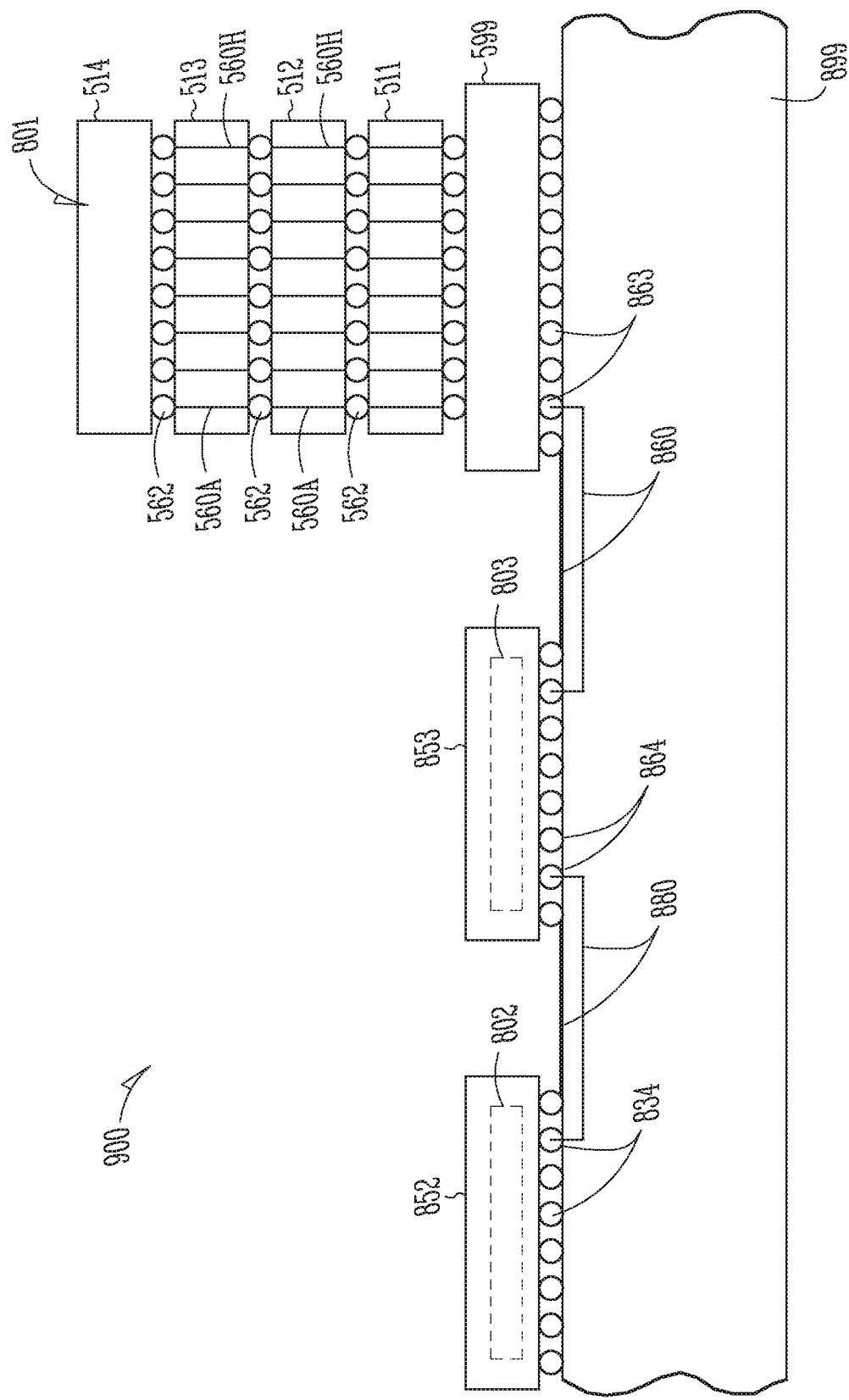
FIG. 9 shows a side view of a portion of an apparatus, which can be a variation of the apparatus of FIG. 8, according to some embodiments described herein.

FIG. 9 shows a side view of a portion of an apparatus 900, which can be a variation of apparatus 800 of FIG. 8, according to some embodiments described herein. Apparatus 900 can include elements similar to or identical to those of apparatus 800. Similar or identical elements between apparatuses 800 and 900 are given the same designation numbers.

The differences between apparatuses 800 and 900 include the arrangement of memory device 801 and memory controller device 803 in FIG. 9. For example, in FIG. 9, memory device 801 and memory controller device 803 can be directly coupled to base 899, such that base 889 (FIG. 8) can be eliminated from apparatus 900 of FIG. 9.

In the arrangement of apparatus 900 in FIG. 9, connections 864 of memory controller device 803 can be directly coupled to connection 880 (which is coupled to host device 802) of base 899 without going through connections on another base (e.g., base 889 in FIG. 8). In FIG. 9, connections 863 of memory device 801 can be coupled to connection 860 (which is coupled to memory controller device 803) without going through connections on another base (e.g., base 889 in FIG. 8).

Figure 10:
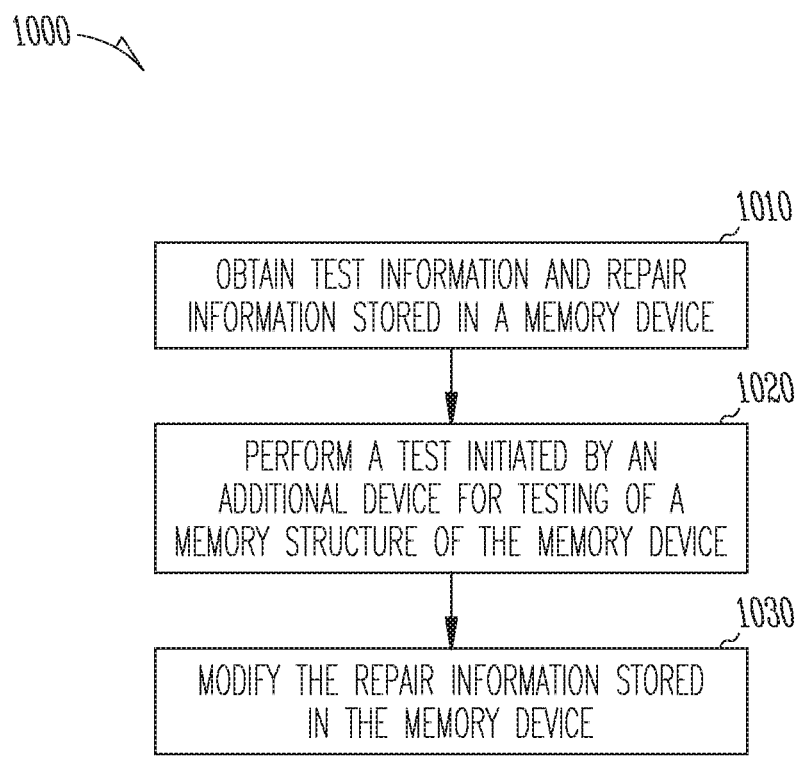
FIG. 10 is a flow diagram showing a method, according to some embodiments described herein.

FIG. 10 is a flow diagram showing a method 1000, according to some embodiments described herein. Method 1000 can be used for testing and repair of a memory structure of a memory device. Method 1000 can be performed by devices of an apparatus, such as apparatus 100, 200, 300, 600, 700, 800, and 900 described above with reference to FIG. 1 through FIG. 9. As shown in FIG. 10, method 1000 can include activities 1010, 1020, and 1030.

Activity 1010 can include obtaining test information and repair information stored in a memory device. The memory device in activity 1010 can include a memory device described above with reference to FIG. 1 through FIG. 9, such as memory device 101, 201, 301, 401, 501, 601, 701, and 801 described above with reference to FIG. 1 through FIG. 9. Thus, the test information and repair information in activity 1010 can include the test and repair information in the memory device described above with reference to FIG. 1 through FIG. 9.

Activity 1020 of method 1000 in FIG. 10 can include performing a test initiated by an additional device for testing of the memory structure. The additional device in activity 1020 can be the same device in activity 1010 that obtains the test information and the repair information stored in the memory device. The additional device can include either a host device or a memory controller device (e.g., in embodiments where a host device and a memory controller device are actually separate devices). The host device and the memory controller device can include a host device and a memory controller device described above with reference to FIG. 1 through FIG. 9, such as host device 102, 202, 302, and 602, and memory controller device 703 and 803.

Testing of the memory structure of the memory device in activity 1020 can include activities and operations similar to, or identical to, those of testing of a memory structure of a memory device described above with reference to FIG. 1 through FIG. 9, such as testing of a memory structure of memory device 101, 201, 301, 401, 501, 601, 701, and 801.

Activity 1030 of method 1000 in FIG. 10 can include modifying the repair information stored in the memory device. The additional device (e.g., either a host device or a memory controller device) in activities 1010 and 1020 may modify the repair information stored in the memory device if an additional portion of the memory structure is determined to be defective, based on the result from the testing of the memory structure of the memory in activity 1020. The additional device may keep the repair information unchanged if no additional portion of the memory structure is determined to be defective.

Method 1000 may include fewer or more activities than the activities shown in FIG. 10. For example, method 1000 can include activities associated with the operations described above with reference to FIG. 1 through FIG. 9, including operations for testing and repairing a memory structure of a memory device in an apparatus, such as of apparatus 100, 200, 300, 400, 500, 600, 700, 800, and 900 described above with reference to FIG. 1 through FIG. 9.

The illustrations of apparatuses (e.g., apparatuses 100, 200, 300, 600, 700, 800, and 900, memory devices 101, 201, 301, 401, 501, 601, 701, and 801) and methods (e.g., operating methods associated with apparatuses 100, 200, 300, 600, 700, 800, and 900, and methods associated with FIG. 10) are intended to provide a general understanding of the structure of various embodiments and are not intended to provide a complete description of all the elements and features of apparatuses that might make use of the structures described herein. An apparatus herein can refer to, for example, circuitry, a die, a device (e.g., memory devices 101, 201, 301, 401, 501, 601, 701, and 801, host devices 102, 202, 302, 602, 702, and 802, and memory controller devices 703 and 803), part of a device (e.g., memory management units 106 and 206), or a system (e.g., a computer, a cellular phone, or other electronic system) that includes a device (e.g., memory devices 101, 201, 301, 401, 501, 601, 701, and 801, host devices 102, 202, 302, 602, 702, and 802, and memory controller devices 703 and 803).

The apparatuses (e.g., memory devices 101, 201, 301, 401, 501, 601, 701, and 801, host devices 102, 202, 302, 602, 702, and 802, and memory controller devices 703 and 803, part of a memory device (e.g., non-volatile memory 105 and 205), part of a host device (e.g., memory management unit 106 or 206, control circuitry 233, test component 240, and repair component 250), and part of a memory controller device (e.g., memory management units 106 and 206) described above may all be characterized as "modules" (or "module") herein. Such modules may include hardware circuitry, single and/or multi-processor circuits, memory circuits, software program modules and objects and/or firmware, and combinations thereof, as desired and/or as appropriate for particular implementations of various embodiments.

Memory devices 101, 201, 301, 401, 501, 601, 701, and 801, host devices 102, 202, 302, 602, 702, and 802, and memory controllers 703 and 803 may be included in apparatuses (e.g., electronic circuitry) such as high-speed computers, communication and signal processing circuitry, single or multi-processor modules, single or multiple embedded processors, multi-core processors, message information switches, and application-specific modules including multilayer, multi-chip modules. Such apparatuses may further be included as sub-components within a variety of other apparatuses (e.g., electronic systems), such as televisions, cellular telephones, personal computers (e.g., laptop computers, desktop computers, handheld computers, tablet computers, etc.), workstations, radios, video players, audio players (e.g., MP3 (Motion Picture Experts Group, Audio Layer 3) players), vehicles, medical devices (e.g., heart monitor, blood pressure monitor, etc.), set top boxes, and others.

The embodiments described above with reference to FIG. 1 through FIG. 10 include apparatuses and methods having a first interface to communicate with a processing unit, a second interface to communicate with a memory device, and a module included coupled to the first and second interfaces. In at least one of the embodiments, the module can be configured to obtain information stored in the memory device and perform at least one of testing and repairing of a memory structure of the memory device based at least in part on the information. Other embodiments including additional apparatuses and methods are described.

The above description and the drawings illustrate some embodiments of the invention to enable those skilled in the art to practice the embodiments of the invention. Other embodiments may incorporate structural, logical, electrical, process, and other changes. Examples merely typify possible variations. Portions and features of some embodiments may be included in, or substituted for, those of others. Many other embodiments will be apparent to those of skill in the art upon reading and understanding the above description.

What is claimed is:

1. A memory device comprising:
a memory structure;
a non-volatile memory comprising memory elements that store:
repair information indicating a first address of a first defective portion of the memory structure, and
test information for testing of the memory structure;
a first port that receives access requests for the memory structure; and
a second port that:
in response to a read request from an additional device separated from the memory device, transmits the test information from the non-volatile memory to the additional device during a test; and
receives, from the additional device, a second address of a second defective portion of the memory structure;
the memory device being configured to:
modify the repair information to indicate the received second address of the second defective portion of the memory structure.

2. The memory device of claim 1, wherein the memory device is further configured to:
receive, via the second port, control information for testing of the memory structure during the test, the test being initiated by the additional device.

3. The memory device of claim 1, wherein the memory structure includes multiple dice.

4. The memory device of claim 1, wherein the non-volatile memory includes read-only memory to store the test information.

5. The memory device of claim 1, wherein the non-volatile memory includes programmable elements to store the repair information.

6. The memory device of claim 1, wherein the second port is compatible with a Joint Test Action Group port.

7. A memory controller comprising:
a first interface configured to communicate via a first connection with a processor;
a second interface configured to communicate via a second connection with a memory device separated from the memory controller; and
control circuitry coupled to the first and second interfaces, the control circuitry configured to perform operations comprising:
obtaining test information from the memory device via the second interface;
testing a memory structure of the memory device during a test based at least in part on the test information; and
based on a portion of the memory structure being determined from the test to be defective, modifying repair information stored in the memory device to indicate an address in the memory structure of the defective portion of the memory structure.

8. The memory controller of claim 7, wherein the control circuitry is further configured to control a flow of information between the first and second interfaces.

9. The memory controller of claim 7, wherein the control circuitry is further configured to generate test data for the testing of the memory structure.

10. The memory controller of claim 7, wherein the operations further comprise:
based on an incoming address associated with a memory access being included in a repair lookup table in the memory controller, redirecting the memory access to a replacement address indicated by the repair lookup table.

11. The memory controller of claim 7, wherein the operations further comprise redirecting memory accesses that are directed to the defective portion to a replacement portion.

12. The memory controller of claim 11, wherein the replacement portion is included in the memory device.

13. The memory controller f claim 11, wherein the replacement portion is included in the memory controller.

14. An apparatus comprising:
a first device comprising:
a memory structure that stores data;
a non-volatile memory comprising memory elements that store repair information indicating an address in the memory structure of a defective portion of the memory structure;
a first port that receives access requests for the memory structure; and
a second port that receives access requests for the non-volatile memory;
a second device coupled via the second port to the first device, the second device including a memory management unit configured to perform operations comprising:
obtaining the repair information via the second port; and
repairing the defective portion based on the repair information by generating a repair lookup table to redirect memory accesses made to the defective portion of the memory structure instead to a replacement portion of the memory structure; and
a base including conductive paths, the first and second devices being located on the base, at least a portion of the conductive paths being coupled to the first and second devices.

15. The apparatus of claim 14, wherein:
the first device also stores test information; and
the operations further comprise:
    obtaining the test information for conducting a test; and
    testing the memory structure based at least in part on the test information to determine whether an additional portion of the memory structure is defective.

16. The apparatus of claim 15, the operations further comprising modifying the repair information to indicate an address of the additional portion of the memory structure if the additional portion of the memory structure is determined to be defective.

17. The apparatus of claim 14, wherein the second device includes a memory controller.

18. The apparatus of claim 14, wherein the conductive paths include metal traces.

19. The apparatus of claim 14, wherein the base includes an organic base.

20. The apparatus of claim 14, wherein the non-volatile memory includes read-only memory to store the repair information.

\* \* \* \* \*